United States Patent
Müller et al.

(10) Patent No.: US 11,825,663 B2
(45) Date of Patent: Nov. 21, 2023

(54) FERROELECTRIC NONVOLATILE MEMORY DEVICE AND INTEGRATION SCHEMES

(71) Applicant: GLOBALFOUNDRIES U.S. Inc., Malta, NY (US)

(72) Inventors: Johannes Müller, Dresden (DE); Thomas Melde, Dresden (DE); Stefan Dünkel, Dresden (DE); Ralf Richter, Radebeul (DE)

(73) Assignee: GlobalFoundries U.S. Inc., Malta, NY (US)

( * ) Notice: Subject to any disclaimer, the term of this patent is extended or adjusted under 35 U.S.C. 154(b) by 144 days.

(21) Appl. No.: 17/403,880

(22) Filed: Aug. 17, 2021

(65) Prior Publication Data
US 2023/0067884 A1    Mar. 2, 2023

(51) Int. Cl.
*H10B 53/30* (2023.01)
*G11C 11/22* (2006.01)
*H10B 53/10* (2023.01)

(52) U.S. Cl.
CPC ............ *H10B 53/30* (2023.02); *G11C 11/221* (2013.01); *G11C 11/2275* (2013.01); *H10B 53/10* (2023.02)

(58) Field of Classification Search
CPC ...... H10B 53/30; H10B 53/10; G11C 11/221; G11C 11/2275
See application file for complete search history.

(56) References Cited

U.S. PATENT DOCUMENTS

| | | | |
|---|---|---|---|
| 6,730,950 B1 * | 5/2004 | Seshadri | H01L 23/522 257/532 |
| 6,859,088 B2 | 2/2005 | Toyoda et al. | |
| 2002/0127801 A1 * | 9/2002 | Kang | H10B 53/00 438/257 |
| 2015/0004718 A1 * | 1/2015 | Sun | H01L 21/76849 438/3 |
| 2015/0214322 A1 | 7/2015 | Mueller et al. | |
| 2019/0067297 A1 | 2/2019 | Mueller et al. | |
| 2022/0077319 A1 * | 3/2022 | Ramamoorthy | H01L 29/78618 |

OTHER PUBLICATIONS

Susumu Horita et al., Disturb-Free Writing Operation for Ferroelectric Gate Field-Effect Transistor Memories With Intermediate Electrodes, IEEE Transactions on Electron Devices, Dec. 2019, pp. 3090-3096, vol. 56—No. 12, IEEE.

* cited by examiner

*Primary Examiner* — Jerome Leboeuf
(74) *Attorney, Agent, or Firm* — David Cain (57) ABSTRACT

A nonvolatile memory device is provided, the device comprising a ferroelectric memory capacitor arranged over a first active region contact of a first transistor and a gate contact of a second transistor, whereby the ferroelectric memory capacitor at least partially overlaps a gate of the first transistor.

19 Claims, 11 Drawing Sheets

FERROELECTRIC NONVOLATILE MEMORY DEVICE AND INTEGRATION SCHEMES

FIELD OF THE INVENTION

The disclosed embodiments relate generally to nonvolatile memory devices, and more particularly, to ferroelectric nonvolatile memory devices with low program and erase voltages, good endurance and retention.

BACKGROUND

Nonvolatile memory devices retain stored memory even when power is removed. A ferroelectric nonvolatile memory device uses ferroelectric material to store information. For example, a polarization state of the ferroelectric material influences a threshold voltage of the ferroelectric nonvolatile memory device. Changing the polarization state of the ferroelectric material will provide a different threshold voltage. The two different threshold voltage values may be used to store information such as "0" and "1", respectively. A conventional ferroelectric nonvolatile memory device may include a ferroelectric material in a gate stack of a transistor. An interfacial layer may be placed between the ferroelectric material and a channel of the transistor to maintain quality of a surface of the channel.

Programming the ferroelectric nonvolatile memory device includes applying a voltage to the ferroelectric material to change the polarization state. However, a voltage drop across the interfacial layer in the gate stack leads to a high programming voltage. A separate write gate will lead to a lower programming voltage as the programming voltage is applied directly to the ferroelectric material, bypassing the interfacial layer. However, the addition of the write gate to the ferroelectric nonvolatile memory device will require a two transistor bit cell as compared to the conventional one transistor bit cell, leading to a significant increase in cell area. Thus, there is a need to overcome the challenges mentioned above.

SUMMARY

In an aspect of the present disclosure, a nonvolatile memory device is provided, the device comprising a ferroelectric memory capacitor arranged over a first active region contact of a first transistor and a gate contact of a second transistor, whereby the ferroelectric memory capacitor at least partially overlaps a gate of the first transistor.

In another aspect of the present disclosure, an array of nonvolatile memory devices is provided, the array comprising a first ferroelectric memory capacitor arranged over a first active region contact of a first transistor and a gate contact of a second transistor, whereby the first ferroelectric memory capacitor at least partially overlaps a gate of the first transistor. A second ferroelectric memory capacitor is arranged adjacent to the first ferroelectric memory capacitor, whereby the second ferroelectric memory capacitor is arranged over a first active region contact of a third transistor and a gate contact of a fourth transistor, and the second ferroelectric memory capacitor at least partially overlaps a gate of the third transistor. An active region of the second transistor, whereby a gate of the second transistor and a gate of the fourth transistor are arranged over the active region of the second transistor In yet another aspect of the present disclosure, a method of fabricating a nonvolatile memory device is provided, the method comprising forming a gate of a first transistor. A first active region contact of the first transistor may be formed. A gate contact of a second transistor may be formed. A ferroelectric memory capacitor may be formed over the first active region contact of the first transistor and the gate contact of the second transistor, whereby the ferroelectric memory capacitor at least partially overlaps the gate of the first transistor.

Numerous advantages may be derived from the embodiments described below. The embodiments provide a nonvolatile memory device having a ferroelectric memory capacitor and two transistors, whereby a portion of the two transistors are arranged below the ferroelectric memory capacitor, thereby providing a compact arrangement with minimal increase in cell area. The ferroelectric memory capacitor may be directly accessed via contacts of the two transistors. The nonvolatile memory device has low program and erase voltages, improved endurance, and good retention characteristics.

BRIEF DESCRIPTION OF THE DRAWINGS

The disclosed embodiments will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1:
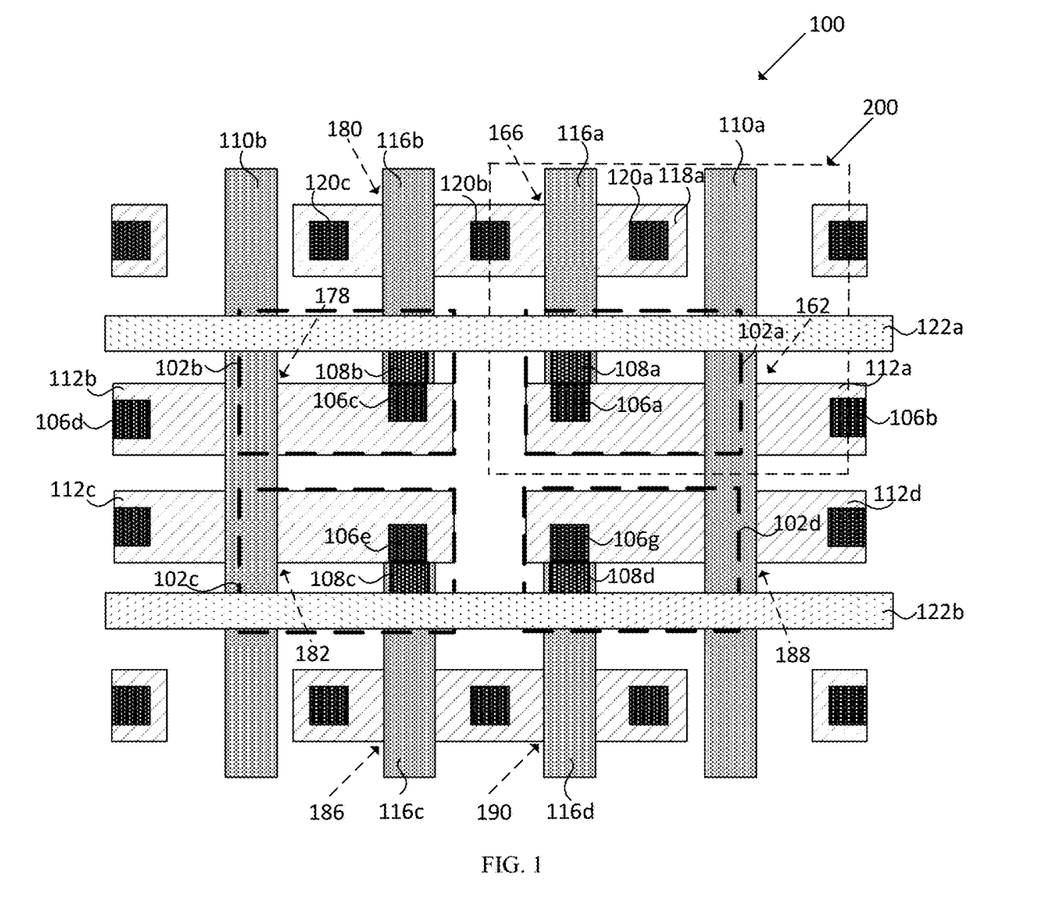
FIG. 1 illustrates a top down view of an array of nonvolatile memory devices, according to an embodiment of the disclosure.

FIG. 1 illustrates a top down view of an array of nonvolatile memory devices 100, according to an embodiment of the disclosure. The array 100 includes a nonvolatile memory device 200. Referring to FIG. 1, the nonvolatile memory device 200, encircled by a dashed outline, may include a first ferroelectric memory capacitor 102a, a first transistor 162 and a second transistor 166. The first transistor 162 may include active region contacts 106a and 106b, and a gate 110a over an active region 112a. The first active region contact 106a may be placed on an opposite side of the gate 110a as the second active region contact 106b. In one embodiment, the second active region contact 106b may be connected to a program line. In a preferred embodiment, the program line may be coupled to the bit line to realize a four terminal memory device, as shown in subsequent paragraphs. The coupling may be done in an upper metallization layer. A metallization layer 122a may be placed over the first ferroelectric memory capacitor 102a, whereby the metallization layer 122a may be connected to a word line.

The second transistor 166 may include active region contacts 120a and 120b, and a gate 116a over an active region 118a. A first portion of the gate 116a may be over the active region 118a, and a second portion of the gate 116a may extend beyond the active region 118a and include a gate contact 108a. The first active region contact 120a may be arranged between the gate 116a of the second transistor 166 and the gate 110a of the first transistor 162. The second active region contact 120b may be placed on an opposite side of the gate 116a as the first active region contact 120a. In one embodiment, the first active region contact 120a may be connected to a bit line and the second active region contact 120b may be connected to a source line.

The first ferroelectric memory capacitor 102a may be arranged over the first active region contact 106a of the first transistor 162 and the gate contact 108a of the second transistor 166. The second active region contact 106b may be spaced apart from the first ferroelectric memory capacitor 102a. A portion of the active region 112a of the first transistor 162 may be arranged next to and perpendicular to the second portion of the gate 116a of the second transistor 166 and placed under the first ferroelectric memory capacitor 102a. The arrangement provides a compact layout of the first transistor 162 and the second transistor 166 under the first ferroelectric memory capacitor 102a. In one embodiment, the first active region contact 106a may be connected to the gate contact 108a for ease of fabrication. In an alternative embodiment, the first active region contact 106a may be spaced apart from the gate contact 108a.

The gate 110a of the first transistor 162 may be parallel to the gate 116a of the second transistor 166. The active region 118a, first 120a and second 120b active region contacts of the second transistor 166 may be spaced apart from the first ferroelectric memory capacitor 102a. In an alternative embodiment, a portion of the active region 118a may be adjacent to the first ferroelectric memory capacitor 102a. The first ferroelectric memory capacitor 102a may at least partially overlap the gate 110a and the active region 112a of the first transistor 162, and the second portion of gate 116a of the second transistor 166. In an alternative embodiment, the first ferroelectric memory capacitor 102a may completely overlap the width of the gate 110a. A compact arrangement of the nonvolatile memory device 200 may be provided with the above described configuration.

The nonvolatile memory device 200 may form part of the array of nonvolatile memory devices 100. The array of nonvolatile memory devices 100 may further include a second ferroelectric memory capacitor 102b adjacent to the first ferroelectric memory capacitor 102a. The second ferroelectric memory capacitor 102b may at least partially overlap a third transistor 178 and a gate 116b of a fourth transistor 180. For example, the second ferroelectric memory capacitor 102b may be arranged over an active region contact 106c of the third transistor 178 and a gate contact 108b over the gate 116b of the fourth transistor 180. The third transistor 178 may include active region contacts 106c and 106d on opposing sides of a gate 110b over an active region 112b. The fourth transistor 180 may include active region contacts 120b and 120c on opposing sides of the gate 116b over the active region 118a. A first portion of the gate 116b may be over the active region 118a, and a second portion of the gate 116b may extend beyond the active region 118a, with the gate contact 108b over the second portion of the gate 116b. The active region 112b of the third transistor 178 may be arranged next to the gate 116b of the fourth transistor 180, and the gate contact 108b may be adjacent to the active region contact 106c in an embodiment. The fourth transistor 180 may be adjacent to the second transistor 166 and may share the same active region 118a. In one embodiment, a portion of the active region 118a between the gates 116a and 116b may serve as a source for both the second 166 and fourth 180 transistors, thereby providing a compact layout for the array of nonvolatile memory devices 100. The second active region contact 120b may be arranged over the active region 118a between the gates 116a and 116b and may be a source contact for both the second 166 and fourth 180 transistors.

The array of nonvolatile memory devices 100 may further include a third ferroelectric memory capacitor 102c adjacent to the second ferroelectric memory capacitor 102b. The third ferroelectric memory capacitor 102c may at least partially overlap a gate 110b and an active region 112c of a fifth transistor 182, and a gate 116c of a sixth transistor 186. For example, the third ferroelectric memory capacitor 102c may be arranged over an active region contact 106e of the fifth transistor 182 and a gate contact 108c over the gate 116c of the sixth transistor 186. The third transistor 178 and fifth transistor 182 may have a common gate 110b extending over the active region 112b of the third transistor 178 and the active region 112c of the fifth transistor 182, thereby allowing a smaller separation between the active regions 112b and 112c and providing a compact layout.

The array of nonvolatile memory devices 100 may further include a fourth ferroelectric memory capacitor 102d adjacent to the third ferroelectric memory capacitor 102c. In one embodiment, the fourth ferroelectric memory capacitor 102d may be adjacent to the first memory capacitor 102a. The metallization layer 122a may be coupled to both the first ferroelectric memory capacitor 102a and the second ferroelectric memory capacitor 102b, thereby providing a common word line. A metallization layer 122b may extend over both the third ferroelectric memory capacitor 102c and the fourth ferroelectric memory capacitor 102d, providing a common word line to both capacitors 102c and 102d. The fourth ferroelectric memory capacitor 102d may be arranged over an active region contact 106g of a seventh transistor 188 and a gate contact 108d over a gate 116d of an eighth transistor 190. The fourth ferroelectric memory capacitor 102d may at least partially overlap a gate 110a and an active region 112d of the seventh transistor 188, and the gate 116d of the eighth transistor 190. The first transistor 162 and the seventh transistor 188 may have a common gate 110a extending over the active region 112a of the first transistor 162 and the active region 112d of the seventh transistor 188 thereby allowing a smaller separation between the active region 112a and the active region 112d and a more compact layout. For example, a spacing between the active region 112a and the active region 112d may be at least half that of a spacing between the active region 112a and the active region 118a. A spacing between the active regions 112b and 112c may be approximately equal to the spacing between the active regions 112a and 112d. A spacing between the active regions 112b and 118a may be approximately equal to the spacing between the active regions 112a and 118a.

In one embodiment, the spacing between the active region contact 106a of the first transistor 162 and the active region contact 106c of the third transistor 178 may be substantially the same as the spacing between the active region contact 106e of the fifth transistor 182 and the active region contact 106g of the seventh transistor 188. [The spacing may be at least equal to a distance between the gates 116a and 116b. In another embodiment, the spacing between the active region contact 106a of the first transistor 162 and the active region contact 106g of the seventh transistor 188 may be substantially the same as the spacing between the active region contact 106c of the third transistor 178 and the active region contact 106e of the fifth transistor 182. The spacing may be at least equal to a separation distance between the active region 112a and the active region 112d.

Figure 2:
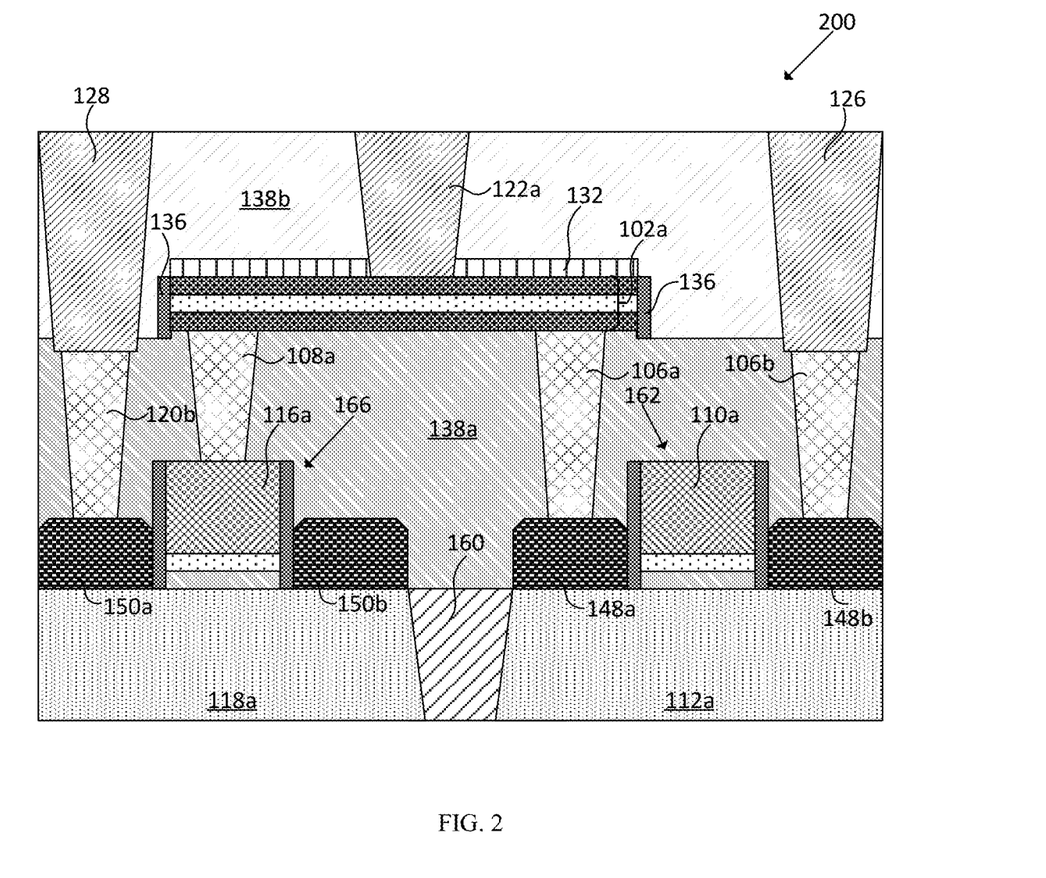
FIG. 2 illustrates a schematic side view of a nonvolatile memory device, according to an embodiment of the disclosure.

FIG. 2 illustrates a schematic side view of the nonvolatile memory device 200, according to an embodiment of the disclosure. It should be appreciated that the schematic side view shown in FIG. 2 is for illustrative purposes to show a fabrication process flow for the nonvolatile memory device 200. Referring to FIG. 2, an active region 112a of a first transistor 162 may be arranged next to an active region 118a of a second transistor 166 and separated by an isolation structure 160. In one embodiment, the isolation structure 160 may be a shallow trench isolation (STI). A gate 110a of the first transistor 162 may be placed over the active region 112a of the first transistor 162. In a preferred embodiment, an epitaxial structure 148a may be placed over the active region 112a, next to the gate 110a of the first transistor 162. An epitaxial structure 148b may be placed over the active region 112a, on an opposite side of the gate 110a from the epitaxial structure 148a. The epitaxial structures 148a and 148b may serve as a source and a drain, respectively, of the first transistor 162. In an alternative embodiment, the source and the drain of the first transistor 162 may be a doped region of the active region 112a. A first active region contact 106a of the first transistor 162 may be placed over the epitaxial structure 148a. A second active region contact 106b of the first transistor 162 may be placed over the epitaxial structure 148b.

Epitaxial structures 150a and 150b may be placed over the active region 118a of the second transistor 166, next to the gate 116a. The epitaxial structures 150a and 150b may serve as a source and a drain, respectively. A gate contact 108a of the second transistor 166 may be placed over the gate 116a. A second 120b active region contact may be placed over the epitaxial structure 150a. The first 106a and second 106b active region contacts of the first transistor 162, second 120b active region contact of the second transistor 166 and the gate contact 108a may be arranged in an interlayer dielectric (ILD) layer 138a. A first ferroelectric memory capacitor 102a may be arranged over the interlayer dielectric layer 138a, the first active region contact 106a of the first transistor 162 and the gate contact 108a of the second transistor 166. The first ferroelectric memory capacitor 102a may at least partially overlap the gate 110a and active region 112a of the first transistor 162, and the gate 116a of the second transistor 166. A liner material 136 may be arranged over a side surface of the first ferroelectric memory capacitor 102a. A hard mask layer 132 may be arranged over a top surface of the first ferroelectric memory capacitor 102a. An inter metal dielectric (IMD) layer 138b may be placed over the first ferroelectric memory capacitor 102a, liner material 136 and hard mask layer 132.

A metallization layer 122a may be placed over the top surface of the first ferroelectric memory capacitor 102a. A side surface of a lower portion of the metallization layer 122a may be covered by the hard mask layer 132. A program line 126 may be placed over the second 106b active region contact of the first transistor 162. The program line 126 may at least partially overlap and is wider than the second active region contact 106b. In a preferred embodiment, the program line 126 may completely overlap the second active region contact 106b. For example, a bottom surface of the program line 126 may be wider than a top surface of the second active region contact 106b. A source line 128 may be placed over the second 120b active region contact of the second transistor 166. The metallization layer 122a, program line 126 and source line 128 may be placed in the inter metal dielectric layer 138b.

Figure 3A:
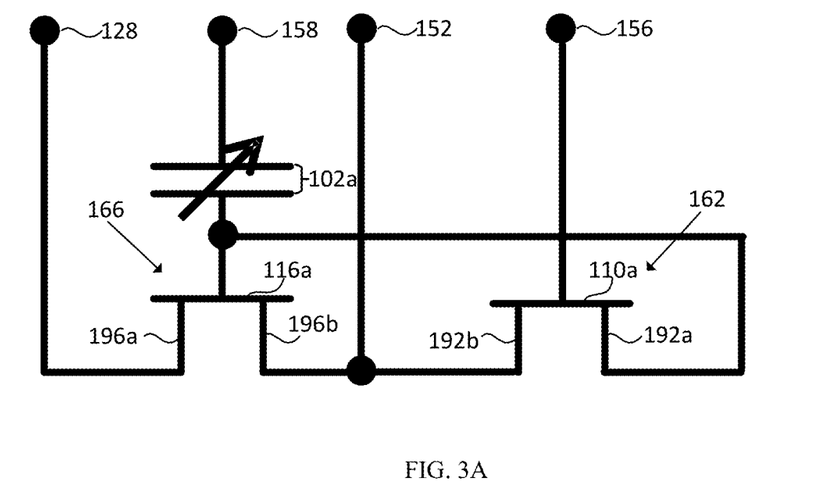
FIG. 3A illustrates an equivalent circuit of a nonvolatile memory device, according to an embodiment of the disclosure.

FIG. 3A illustrates an equivalent circuit of the nonvolatile memory device 200, according to an embodiment of the disclosure. The equivalent circuit shown is a four terminal memory device. Referring to FIG. 3A, a first transistor 162 is shown having a gate 110a, a source 192a connected to a bottom electrode of a first ferroelectric memory capacitor 102a, and a drain 192b connected to a bit line 152. The gate 110a of the first transistor 162 may be connected to a program enable line 156. A second transistor 166 is shown having a gate 116a, a source 196a connected to a source line 128 and a drain 196b connected to the bit line 152. The gate 116a of the second transistor 166 may be connected to the bottom electrode of the first ferroelectric memory capacitor 102a. A top electrode of the first ferroelectric memory capacitor 102a may be connected to a word line 158.

Table 1 below illustrates an exemplary set of biasing conditions for an embodiment of the nonvolatile memory device 200. Referring to table 1, during a read operation, approximately 0.5V may be applied to the bit line 152 and 1V applied to the word line 158. The source line 128 and program enable line 156 may be grounded. A current may be detected at the bit line 152, depending on a polarization state of a ferroelectric layer in the first ferroelectric memory capacitor 102a.

During a write operation, approximately 3V may be applied to the word line 158 and 1V applied to the program enable line 156. The bit line 152 and source line 128 may be grounded. The first transistor 162 is turned on, grounding the bottom electrode of the first ferroelectric memory capacitor 102a. The voltage applied to the word line 158 is applied across the first ferroelectric memory capacitor 102a and setting a polarization state of the ferroelectric layer. An advantage of the nonvolatile memory device 200 is a lower write voltage due to the first transistor 162.

During an inhibit operation, approximately 1.5V may be applied to the bit line 152 and source line 128. Approximately 3V may be applied to the word line 158 and 1V applied to the program enable line 156. The first transistor 162 is turned on, coupling the bit line 152 to the bottom electrode of the first ferroelectric memory capacitor 102a. A voltage across the first ferroelectric memory capacitor 102a is insufficient to affect the polarization state of the ferroelectric layer, thereby preserving the polarization state. An advantage of the nonvolatile memory device 200 is effective inhibit operation due to the first transistor 162.

During an erase operation, approximately 3V may be applied to the bit line 152 and source line 128, and 4V applied to the program enable line 156. The word line 158 may be grounded. The first transistor 162 is turned on, coupling the bit line 152 to the bottom electrode of the first ferroelectric memory capacitor 102a. A polarization state of the first ferroelectric memory capacitor 102a may be reversed. The first transistor 162 provides a lower erase voltage for the nonvolatile memory device 200.

Figure 3B:
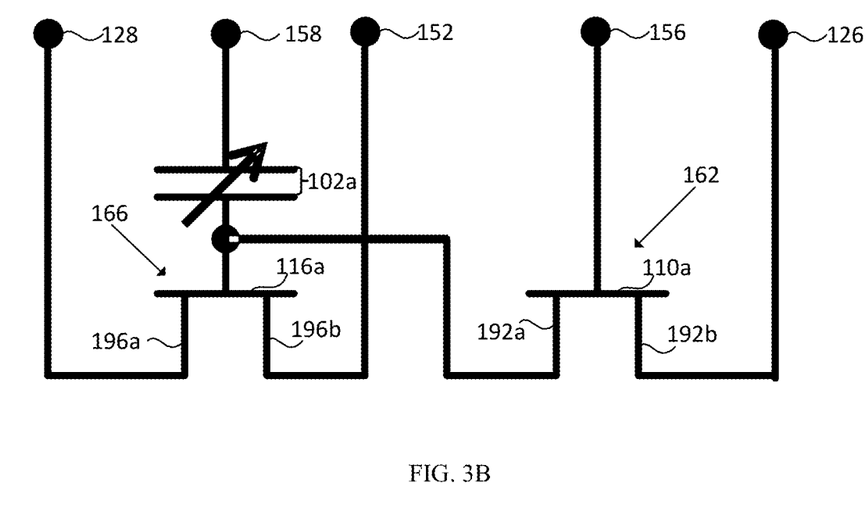
FIG. 3B illustrates an equivalent circuit of a nonvolatile memory device, according to another embodiment of the disclosure.

FIG. 3B illustrates an equivalent circuit of the nonvolatile memory device 200, according to another embodiment of the disclosure. The equivalent circuit shown is a five terminal memory device. Like numerals in FIG. 3A refer to like features in FIG. 3B. In contrast to the equivalent circuit shown in FIG. 3A, a drain 192b of the first transistor 162 may be connected to a program line 126.

TABLE 1

|  | Bit line 152 (V) | Source line 128 (V) | Word line 158 (V) | Program enable line 156 (V) |
|---|---|---|---|---|
| Read | 0.5 | 0 | 1 | 0 |
| Write | 0 | 0 | 3 | 1 |
| Inhibit | 1.5 | 1.5 | 3 | 1 |
| Erase | 3 | 3 | 0 | 4 |

Table 2 below illustrates an exemplary set of biasing conditions for an embodiment of the nonvolatile memory device 200. Referring to table 2, during a read operation, approximately 0.5V may be applied to the bit line 152 and 1V may be applied to the word line 158. The source line 128, program enable line 156 and program line 126 may be grounded. A current may be detected at the bit line 152, depending on a polarization state of a ferroelectric layer in the first ferroelectric memory capacitor 102a.

During a write operation, approximately 3V may be applied to the word line 158 and 2V may be applied to the program enable line 156. The bit line 152, source line 128, and program line 126 may be grounded. The first transistor 162 is turned on, effectively grounding the bottom electrode of the first ferroelectric memory capacitor 102a and allowing the voltage applied to the word line 158 to be effectively applied across the first ferroelectric memory capacitor 102a, thereby setting a polarization state of the ferroelectric layer. An advantage of the nonvolatile memory device 200 is the reduction in the write voltage due to the first transistor 162.

TABLE 2

|  | Bit line 152 (V) | Source line 128 (V) | Word line 158 (V) | Program enable line 156 (V) | Program line 126 (V) |
|---|---|---|---|---|---|
| Read | 0.5 | 0 | 1 | 0 | 0 |
| Write | 0 | 0 | 3 | 2 | 0 |
| Inhibit | 0 | 0 | 3 | 2 | 1.2 |
| Erase | 0 | 0 | 0 | 4 | 3 |

During an inhibit operation, approximately 3V may be applied to the word line 158, 2V may be applied to the program enable line 156 and 1.2V may be applied to the program line 126. The bit line 152 and source line 128 may be grounded. The first transistor 162 is turned on, coupling the program line 126 to the bottom electrode of the first ferroelectric memory capacitor 102a. A voltage drop across the first ferroelectric memory capacitor 102a is not large enough to affect the polarization state of the ferroelectric layer, thereby the polarization state remains unchanged. Another advantage of the nonvolatile memory device 200 is the enabling of an inhibit operation by the first transistor 162, thereby preserving the polarization state of the ferroelectric layer.

During an erase operation, approximately 4V may be applied to the program enable line 156 and 3V may be applied to the program line 126. The bit line 152, source line 128 and word line 158 may be grounded. The first transistor 162 is turned on, coupling the program line 126 to the bottom electrode of the first ferroelectric memory capacitor 102a, thereby flipping a polarization state of the ferroelectric layer. Yet another advantage of the nonvolatile memory device 200 is the reduction in the erase voltage due to the first transistor 162.

Figure 4:
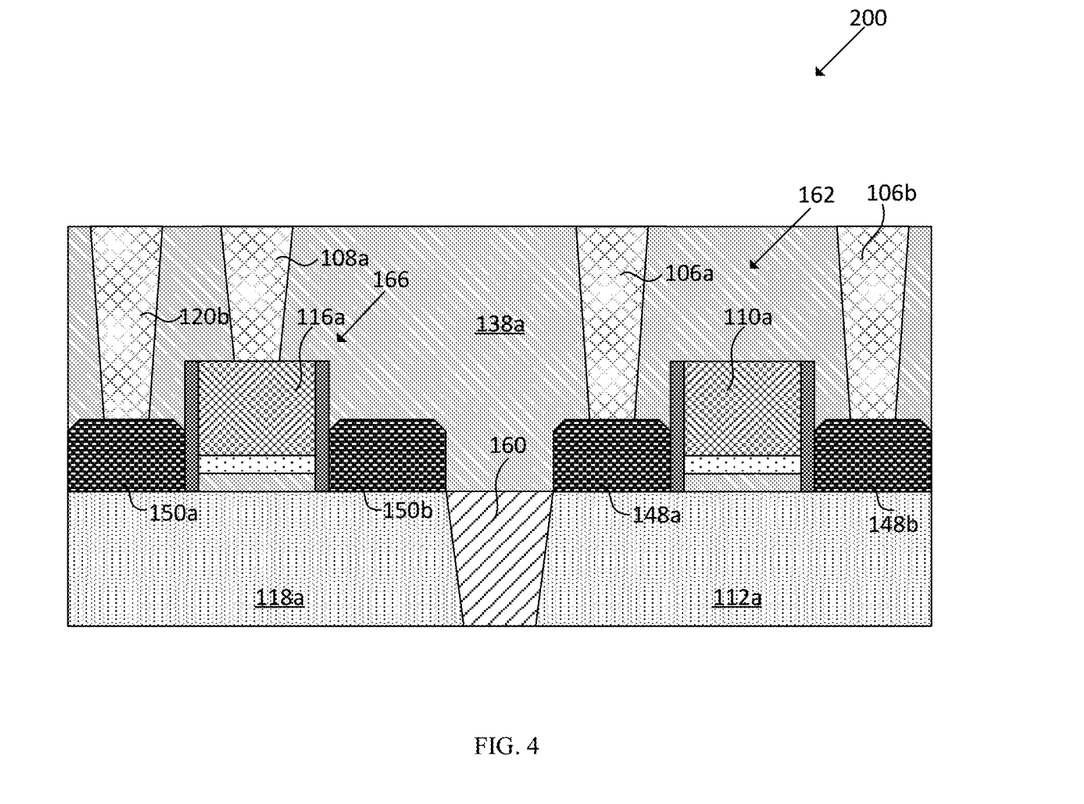
FIGS. 4 to 11 illustrate a fabrication process flow for the nonvolatile memory device shown in FIG. 2, according to some embodiments of the disclosure.

FIGS. 4 to 11 illustrate a fabrication process flow for the nonvolatile memory device 200 shown in FIG. 2, according to some embodiments of the disclosure. FIG. 4 shows a partially completed nonvolatile memory device 200 with a first 162 and second 166 transistors, a first 106a and second 106b active region contacts of the first transistor 162, and a second active region contact 120b and a gate contact 108a of the second transistor 166, according to an embodiment of the disclosure. Referring to FIG. 4, a first transistor 162 and a second transistor 166 may be provided. The first transistor 162 may include an active region 112a, a gate 110a and epitaxial structures 148a and 148b. The second transistor 166 may include an active region 118a, a gate 116a and epitaxial structures 150a and 150b. An isolation structure 160 may be provided to separate the active region 112a of the first transistor 162 from the active region 118a of the second transistor 166. An interlayer dielectric (ILD) layer 138a may be deposited over the first transistor 162 and the second transistor 166. The interlayer dielectric layer 138a may be made of a suitable dielectric material, for example, silicon dioxide ($SiO_2$), high density plasma (HDP) undoped silicate glass (USG), tetraethyl orthosilicate (TEOS), or any other suitable dielectric material. In one embodiment, the interlayer dielectric layer 138a may be deposited by chemical vapor deposition (CVD), physical vapor deposition (PVD), atomic layer deposition (ALD), or any other suitable deposition processes.

A first active region contact 106a and a second active region contact 106b of the first transistor 162, a gate contact 108a and a second 120b active region contact of the second transistor 166 may be formed in the interlayer dielectric layer 138a. The formation of the first 106a and second 106b active region contacts may include forming an opening in the interlayer dielectric layer 138a to expose a portion of the epitaxial structures 148a and 148b, respectively. A layer of a suitable conductive material, for example, tungsten (W), aluminum (Al), or any other suitable conductive material, may be deposited in the opening. The tungsten layer may be deposited by a suitable deposition process, for example, chemical vapor deposition (CVD), physical vapor deposition (PVD), atomic layer deposition (ALD), or any other suitable deposition processes. A suitable planarization process, for example, chemical mechanical planarization (CMP), may be used to remove the tungsten layer from a top surface of the interlayer dielectric layer 138a, leaving the tungsten layer in the opening, thereby forming the first 106a and second 106b active region contacts.

Similarly, the formation of the gate contact 108a and second 120b active region contact of the second transistor 166 may include forming an opening in the interlayer dielectric layer 138a to expose a portion of the gate 116a and epitaxial structure 150a, respectively. A layer of a suitable conductive material, for example, tungsten (W), aluminum (Al), or any other suitable conductive material, may be deposited in the opening. A suitable planarization process, for example, chemical mechanical planarization (CMP), may be used to remove the tungsten layer from the top surface of the interlayer dielectric layer 138a, leaving the tungsten layer in the opening. In a preferred embodiment, the first 106a and second 106b active region contacts of the first transistor 162, gate contact 108a and second 120b active region contact of the second transistor 166 may be made of the same conductive material. In an alternative embodiment, the first 106a and second 106b active region contacts of the first transistor 162, and second 120b active region contact of the second transistor 166 may be made of a different conductive material from the gate contact 108a of the second transistor 166.

Figure 5:
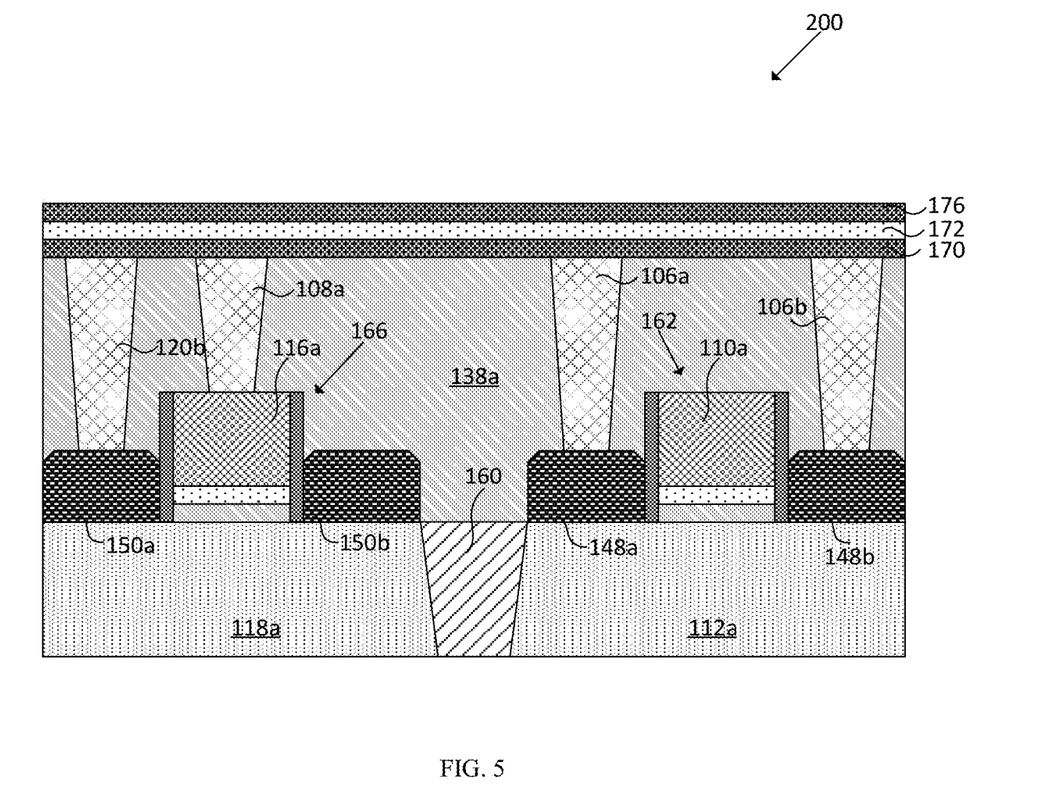

FIG. 5 shows a partially completed nonvolatile memory device 200 after formation of a bottom electrode 170, ferroelectric layer 172 and top electrode 176, according to an embodiment of the disclosure. Referring to FIG. 5, the bottom electrode 170 of the first ferroelectric memory capacitor 102a may be deposited over the first active region contact 106a and second active region contact 106b of the first transistor 162, gate contact 108a and second active region contact 120b of the second transistor 166, and interlayer dielectric layer 138a. The deposition process may include chemical vapor deposition (CVD), physical vapor deposition (PVD), atomic layer deposition (ALD), or any other suitable deposition processes. The bottom electrode 170 may be made of a suitable conductive material, for example, metal nitrides, such as titanium nitride (TiN) or tantalum nitride (TaN), polysilicon, graphene, conductive metal oxides, such as ruthenium oxide ($RuO_2$), or any other suitable conductive material. The ferroelectric layer 172 may be deposited over the bottom electrode 170 by a suitable deposition process, for example, chemical vapor deposition (CVD), physical vapor deposition (PVD), atomic layer deposition (ALD), or any other suitable deposition processes. The ferroelectric layer 172 may be made of hafnium silicate (HfSiO), zirconium silicate (ZrSiO), ferroelectric hafnium dioxide, or any other suitable ferroelectric material. The term "ferroelectric hafnium dioxide" may refer to a material comprising hafnium dioxide doped with silicon (Si), lanthanum (La), yttrium (Y), aluminum (Al) or gadolinium (Gd) or a mixed oxide of hafnium dioxide and zirconium dioxide ($HfO_2$—$ZrO_2$). The top electrode 176 may be deposited over the ferroelectric layer 172 by a suitable deposition process, for example, chemical vapor deposition (CVD), physical vapor deposition (PVD), atomic layer deposition (ALD), or any other suitable deposition processes. The top electrode 176 may be made of metal nitrides, such as titanium nitride (TiN) or tantalum nitride (TaN), polysilicon, graphene, conductive metal oxides, such as ruthenium oxide ($RuO_2$), or any other suitable conductive material. In a preferred embodiment, the bottom electrode 170 and the top electrode 176 may be made of the same conductive material. In an alternative embodiment, the bottom 170 and top 176 electrodes may be made of different conductive materials.

Figure 6:
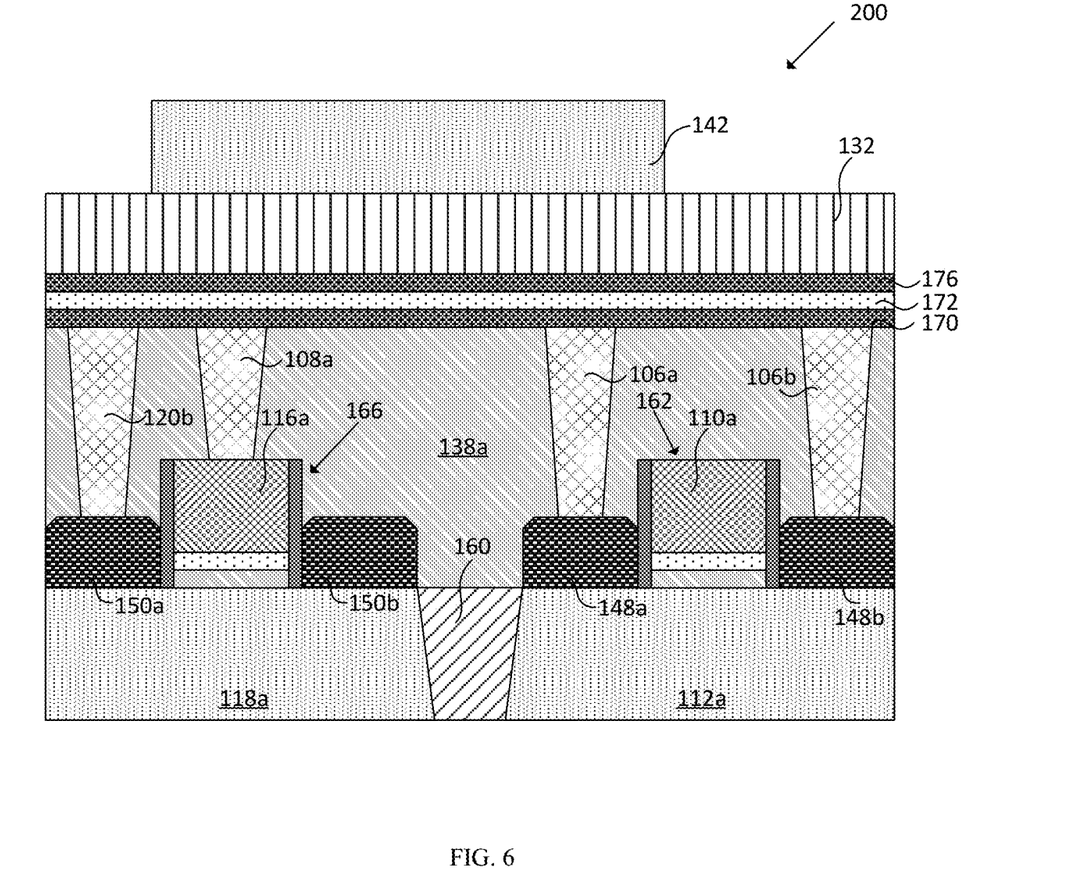

FIG. 6 shows a partially completed nonvolatile memory device 200 after formation of a hard mask layer 132 and photoresist layer 142, according to an embodiment of the disclosure. Referring to FIG. 6, the hard mask layer 132 may be deposited over the top electrode 176 by a suitable deposition process, for example, chemical vapor deposition (CVD), or any other suitable deposition processes. The hard mask layer 132 may be made of a suitable insulating material, for example, silicon nitride ($Si_3N_4$), silicon dioxide ($SiO_2$), tetraethyl orthosilicate (TEOS), or any other suitable insulating material. A purpose of the hard mask layer 132 is to protect the top electrode 176 during a subsequent patterning process. A photoresist layer 142 may be deposited over the hard mask layer 132 and subsequently patterned.

Figure 7:
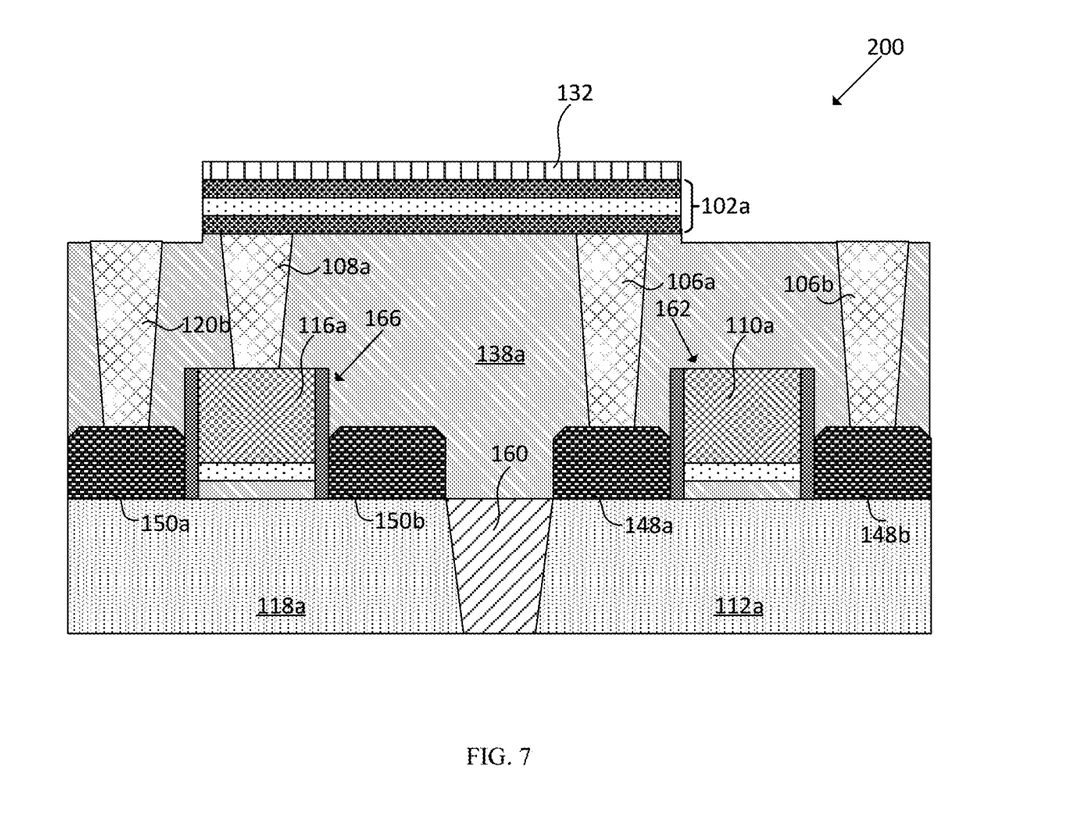

FIG. 7 shows a partially completed nonvolatile memory device 200 after formation of a first ferroelectric memory capacitor 102a, according to an embodiment of the disclosure. Referring to FIG. 7, the hard mask layer 132, top electrode 176, ferroelectric layer 172, and bottom electrode 170 may be patterned using the photoresist layer 142 as a masking layer. The photoresist layer 142 may be removed after the patterning process. A portion of the hard mask layer 132 may remain over the top electrode 176 of the first ferroelectric memory capacitor 102a to protect the top electrode 176 from subsequent etching or patterning processes. The first ferroelectric memory capacitor 102a may be formed over the first active region contact 106a of the first transistor 162 and gate contact 108a of the second transistor 166. The first ferroelectric memory capacitor 102a may at least partially overlap the gate 110a and active region 112a of the first transistor 162, and the gate 116a of the second transistor 166.

Figure 8:
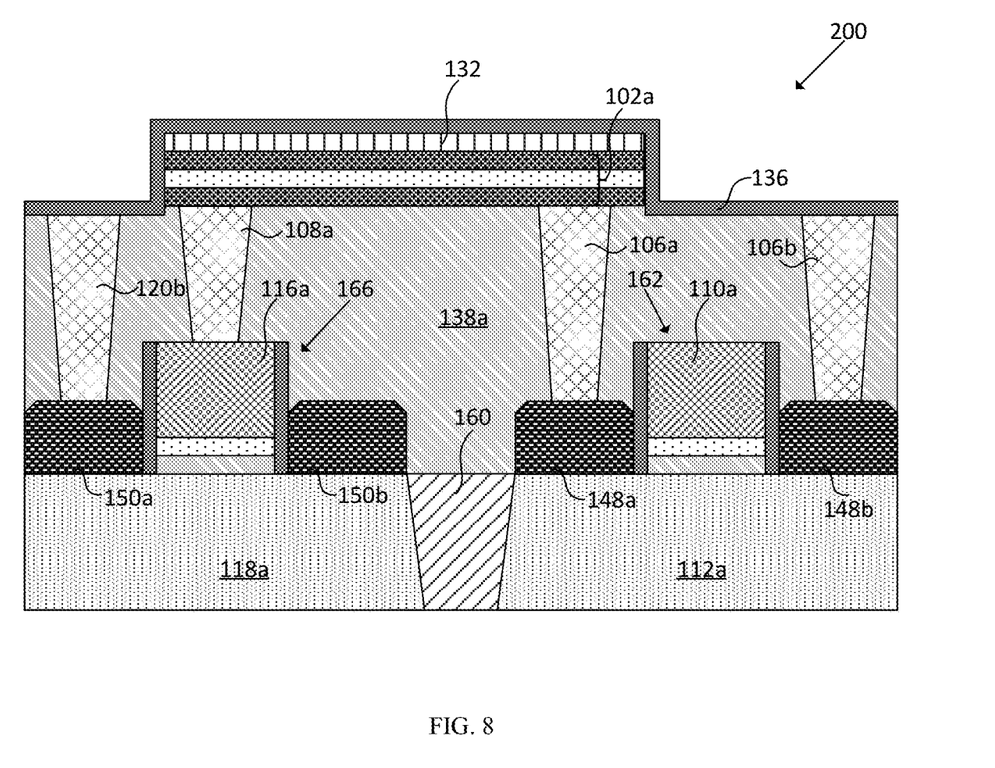

FIG. 8 shows a partially completed nonvolatile memory device 200 after formation of a liner material 136, according to an embodiment of the disclosure. Referring to FIG. 8, the liner material 136 may be deposited over the hard mask layer 132 and side surfaces of the first ferroelectric memory capacitor 102a by a suitable deposition process, for example, chemical vapor deposition (CVD), physical vapor deposition (PVD), atomic layer deposition (ALD), or any other suitable deposition processes. The liner material 136 may be made of silicon nitride ($Si_3N_4$). A purpose of the liner material 136 is to protect the first ferroelectric memory capacitor 102a from exposure to back end of line (BEOL) processes, for example, it protects side surfaces of the first ferroelectric memory capacitor 102a from oxidation due to a subsequent intermetal dielectric (IMD) deposition.

Figure 9:
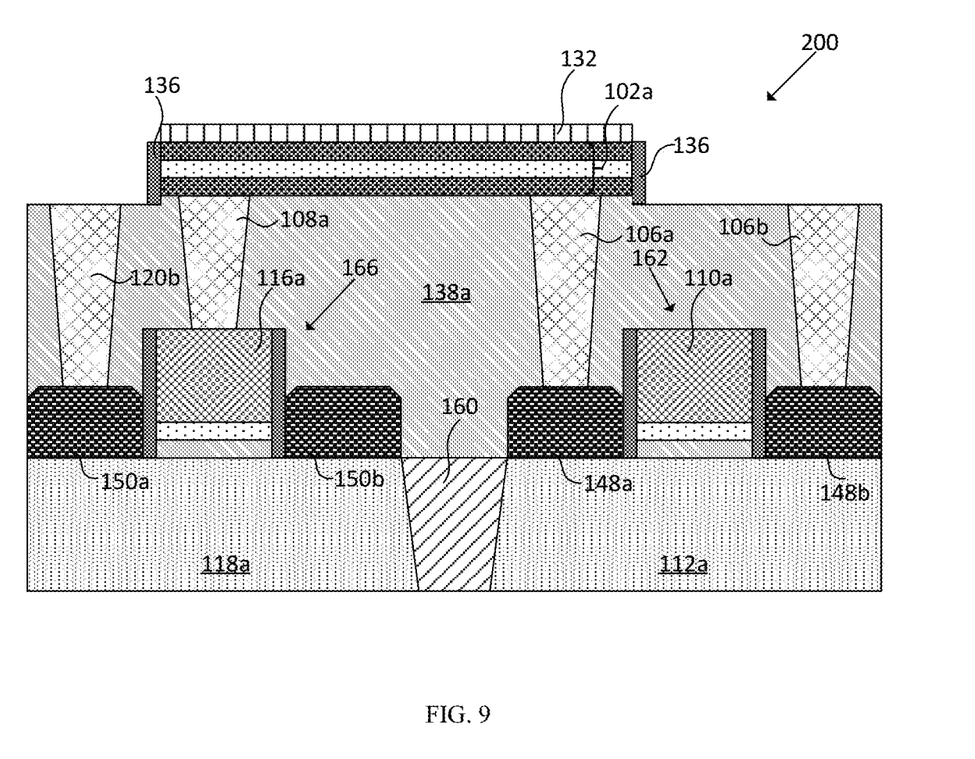

FIG. 9 shows a partially completed nonvolatile memory device 200 after patterning of the liner material 136, according to an embodiment of the disclosure. Referring to FIG. 9, the liner material 136 may be patterned by an anisotropic etching process to leave behind a portion of the liner material 136 over side surfaces of the first ferroelectric memory capacitor 102a. The term "anisotropic etching" may refer to an etching process that is directional in nature.

Figure 10:
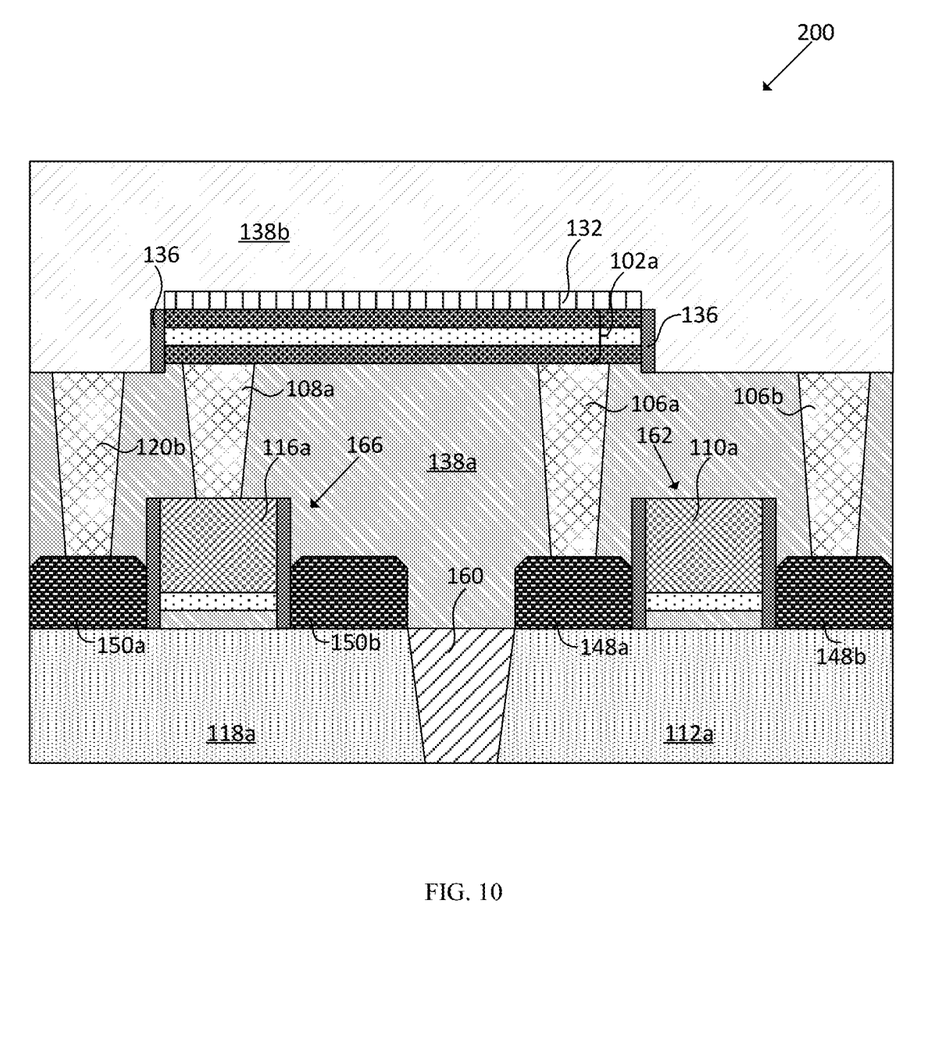

FIG. 10 shows a partially completed nonvolatile memory device 200 after formation of an inter metal dielectric (IMD) layer 138b, according to an embodiment of the disclosure. Referring to FIG. 10, the inter metal dielectric (IMD) layer 138b may be deposited over a top surface of the interlayer dielectric (ILD) layer 138a, second active region contact 106b of the first transistor 162, first ferroelectric memory capacitor 102a, and second 120b active region contact of the second transistor 166. The inter metal dielectric layer 138b may be deposited by a suitable deposition process, for example, chemical vapor deposition (CVD), physical vapor deposition (PVD), or any other suitable deposition processes. In one embodiment, the inter metal dielectric layer 138a may be made of a suitable dielectric material, for example, silicon dioxide ($SiO_2$), undoped silicate glass (USG), fluorinated silicate glass (FSG), tetraethyl orthosilicate (TEOS), or any other suitable dielectric material.

Figure 11:
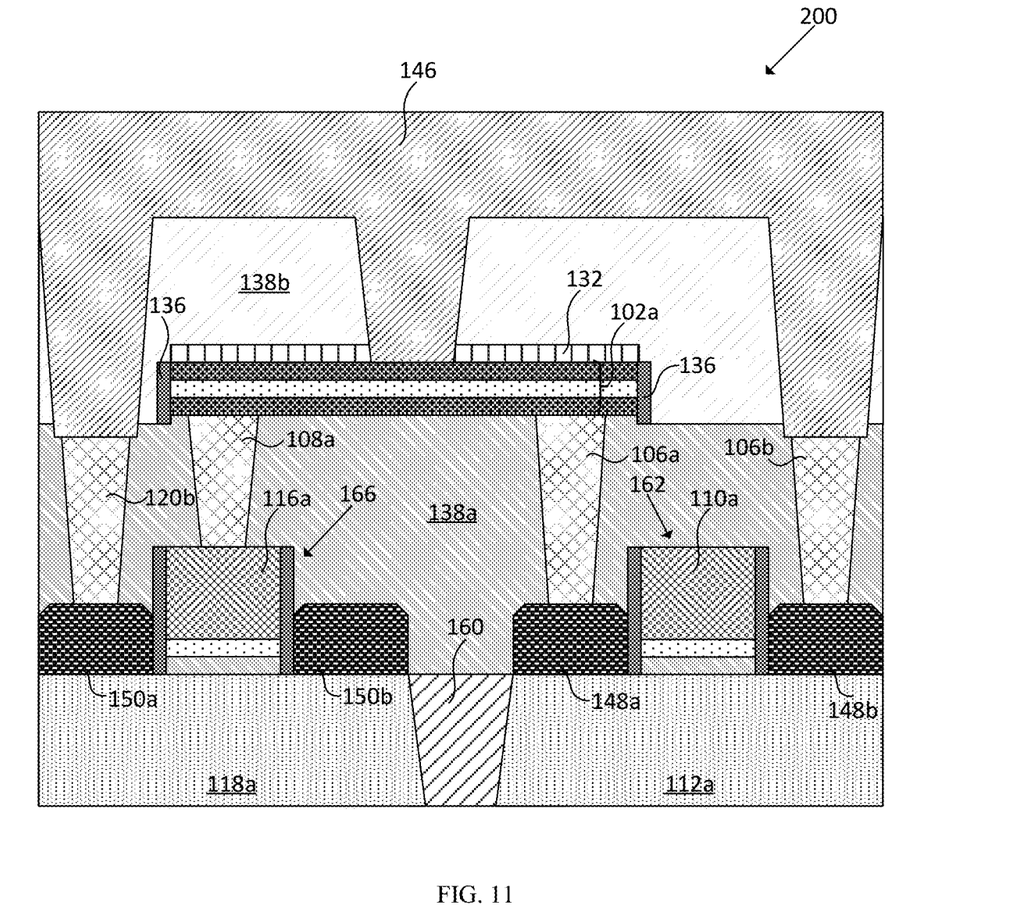

FIG. 11 shows a partially completed nonvolatile memory device 200 after patterning the inter metal dielectric layer 138b and the hard mask layer 132, and deposition of a metallization layer material 146, according to an embodiment of the disclosure. Referring to FIG. 11, the inter metal dielectric layer 138b may be patterned to form an opening over the second active region contact 106b of the first transistor 162, hard mask layer 132, and second 120b active region contact of the second transistor 166. The hard mask layer 132 may be subsequently patterned to expose a portion of a top surface of the first ferroelectric memory capacitor 102a. The metallization layer material 146 may be deposited in the opening in the inter metal dielectric layer 138b and the hard mask layer 132. The metallization layer material 146 may be deposited by a suitable deposition process, for example, electroplating, chemical vapor deposition (CVD), physical vapor deposition (PVD), or any other suitable deposition processes. The metallization layer material 146 may be made of a suitable conductive material, for example, copper (Cu), tungsten (W), aluminum (Al), polysilicon, or any other suitable conductive material. Although not shown, a conductive liner material may be deposited in the opening in the inter metal dielectric layer 138b prior to the deposition of the metallization layer material 146. The conductive liner material may be made of tantalum nitride (TaN), tantalum (Ta) or titanium nitride (TiN). The metallization layer material 146 may be made of a different material from the first 106a and second 106b active region contacts of the first transistor 162, and gate contact 108a and second 120b active region contact of the second transistor 166.

The metallization layer material 146 may subsequently be polished by a suitable process, for example, chemical mechanical planarization (CMP), or any other suitable planarization processes to form the nonvolatile memory device 200 shown in FIG. 2. A portion of the metallization layer material 146 may be left behind in the opening over the second active region contact 106b of the first transistor 162, thereby forming the program line 126. The program line 126 may be wider than the second active region contact 106b for ease of alignment and patterning. Another portion of the metallization layer material 146 may be left behind in the opening over the top surface of the first ferroelectric memory capacitor 102a, thereby forming the metallization layer 122a. Yet another portion of the metallization layer material 146 may be left behind in the opening over the second 120b active region contact of the second transistor 166, thereby forming the source line 128.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A nonvolatile memory device comprising:
   a ferroelectric memory capacitor arranged over a first active region contact of a first transistor and a gate contact of a second transistor, wherein the ferroelectric memory capacitor at least partially overlaps a gate of the first transistor; and
   a metallization layer arranged over the ferroelectric memory capacitor, wherein the metallization layer directly contacts a top surface of the ferroelectric memory capacitor, the metallization layer is a word line.

2. The nonvolatile memory device of claim 1, wherein the gate contact of the second transistor and a portion of a gate of the second transistor are next to the first active region contact of the first transistor.

3. The nonvolatile memory device of claim 2, wherein an active region of the first transistor is arranged perpendicular to the gate of the second transistor.

4. The nonvolatile memory device of claim 2, wherein the gate of the first transistor is parallel to the gate of the second transistor.

5. The nonvolatile memory device of claim 2, further comprising:
   an active region of the second transistor, wherein the gate of the second transistor is arranged over the active region of the second transistor; and
   a first active region contact of the second transistor is arranged between the gate of the first transistor and the gate of the second transistor.

6. The nonvolatile memory device of claim 5, wherein the active region of the second transistor is spaced apart from the ferroelectric memory capacitor.

7. The nonvolatile memory device of claim 5, wherein the first active region contact of the second transistor is connected to a bit line and a second active region contact of the second transistor is connected to a source line.

8. The nonvolatile memory device of claim 1, further comprising:
   a second active region contact of the first transistor, wherein the second active region contact is laterally spaced apart from the ferroelectric memory capacitor, the ferroelectric memory capacitor does not overlap the second active region contact.

9. The nonvolatile memory device of claim 8, wherein the second active region contact of the first transistor is connected to a program line.

10. The nonvolatile memory device of claim 1, further comprising:

a liner material over a side surface of the ferroelectric memory capacitor.

11. An array of nonvolatile memory devices comprising:
a first ferroelectric memory capacitor arranged over a first active region contact of a first transistor and a gate contact of a second transistor, wherein the first ferroelectric memory capacitor at least partially overlaps a gate of the first transistor;
a second ferroelectric memory capacitor arranged adjacent to the first ferroelectric memory capacitor, wherein the second ferroelectric memory capacitor is arranged over an active region contact of a third transistor and a gate contact of a fourth transistor, and the second ferroelectric memory capacitor at least partially overlaps a gate of the third transistor;
a metallization layer arranged over the first ferroelectric memory capacitor and the second ferroelectric memory capacitor, wherein the metallization layer directly contacts a top surface of the first ferroelectric memory capacitor, the gate of the third transistor is a gate of a fifth transistor, and the gate of the third transistor and the fifth transistor extends over an active region of the third transistor and an active region of the fifth transistor; and
an active region of the second transistor, wherein a gate of the second transistor and a gate of the fourth transistor are arranged over the active region of the second transistor.

12. The array of nonvolatile memory devices of claim 11, further comprising:
a source contact over the active region of the second transistor between the gate of the second transistor and the gate of the fourth transistor.

13. The array of nonvolatile memory devices of claim 11, wherein the metallization layer is a word line.

14. The array of nonvolatile memory devices of claim 11, wherein a spacing between the active region of the third transistor and the active region of the fifth transistor is at least half that of a spacing between the active region of the second transistor and the active region of the third transistor.

15. The array of nonvolatile memory devices of claim 11, further comprising:
a third ferroelectric memory capacitor arranged adjacent to the second ferroelectric memory capacitor, wherein the third ferroelectric memory capacitor at least partially overlaps the gate of the fifth transistor.

16. The array of nonvolatile memory devices of claim 15, wherein the gate of the first transistor is a gate of a seventh transistor and a fourth ferroelectric memory capacitor is arranged adjacent to the first ferroelectric memory capacitor and the third ferroelectric memory capacitor, wherein the fourth ferroelectric memory capacitor at least partially overlap the gate of the seventh transistor.

17. A method of fabricating a nonvolatile memory device comprising:
forming a gate of a first transistor;
forming a first active region contact of the first transistor;
forming a gate contact of a second transistor; and
forming a ferroelectric memory capacitor over the first active region contact of the first transistor and the gate contact of the second transistor, wherein the ferroelectric memory capacitor at least partially overlaps the gate of the first transistor; and
forming a metallization layer over the ferroelectric memory capacitor, wherein the metallization layer directly contacts a top surface of the ferroelectric memory capacitor, the metallization layer is a word line.

18. The method of claim 17, wherein the formation of the ferroelectric memory capacitor further comprises:
forming a bottom electrode layer over the first active region contact of the first transistor and the gate contact of the second transistor; and
forming a ferroelectric layer over the bottom electrode layer and a top electrode layer over the ferroelectric layer.

19. The method of claim 18, wherein the metallization layer and the first active region contact of the first transistor are made of different materials.

* * * * *